(12) United States Patent
Tong et al.

(10) Patent No.: US 10,948,441 B2
(45) Date of Patent: Mar. 16, 2021

(54) HIGH-RESOLUTION IN SITU ELECTROCHEMICAL NMR WITH INTERDIGITATED ELECTRODES

(71) Applicant: Georgetown University, Washington, DC (US)

(72) Inventors: YuYe J. Tong, Gaithersburg, MD (US); Eric G. Sorte, Albuquerque, NM (US)

(73) Assignee: Georgetown University, Washington, DC (US)

( * ) Notice: Subject to any disclaimer, the term of this patent is extended or adjusted under 35 U.S.C. 154(b) by 0 days.

(21) Appl. No.: 15/764,811

(22) PCT Filed: Sep. 30, 2016

(86) PCT No.: PCT/US2016/054959
§ 371 (c)(1),
(2) Date: Mar. 29, 2018

(87) PCT Pub. No.: WO2017/059337
PCT Pub. Date: Apr. 6, 2017

(65) Prior Publication Data
US 2018/0284042 A1     Oct. 4, 2018

Related U.S. Application Data

(60) Provisional application No. 62/236,772, filed on Oct. 2, 2015.

(51) Int. Cl.
*G01N 24/08* (2006.01)
*G01R 33/46* (2006.01)
*G01R 33/30* (2006.01)
*C25B 1/00* (2021.01)

(52) U.S. Cl.
CPC ........... *G01N 24/088* (2013.01); *G01R 33/30* (2013.01); *G01R 33/46* (2013.01); *C25B 1/00* (2013.01)

(58) Field of Classification Search
CPC ......... G01N 24/88; G01R 33/30; G01R 33/46
See application file for complete search history.

(56) References Cited

U.S. PATENT DOCUMENTS

| 5,619,140 A * | 4/1997 | Brey ...................... G01R 33/34 29/593 |
| 6,660,141 B1 * | 12/2003 | Minter ............... G01N 33/5438 204/400 |
| 2003/0173967 A1 * | 9/2003 | Gerald, II ........... G01R 33/343 324/322 |
| 2007/0205768 A1 * | 9/2007 | Han ................. G01R 33/34046 324/318 |

(Continued)

FOREIGN PATENT DOCUMENTS

DE         102013014107 B4 * 12/2014 ............. G01R 33/30

*Primary Examiner* — Dominic E Hawkins
(74) *Attorney, Agent, or Firm* — Klarquist Sparkman, LLP

(57) ABSTRACT

A system for carrying out electrochemical nuclear magnetic resonance spectroscopy (EC-NMR) is disclosed, along with methods of manufacturing the EC-NMR system, and methods of using the EC-NMR system to monitor electrochemical reactions. The system comprises interdigitated electrodes arranged in a cylindrically symmetric manner. The system allows for nuclear magnetic resonance spectroscopy to be carried out on a sample during electrolysis with minimal effect to its sensitivity.

17 Claims, 9 Drawing Sheets

(56) References Cited

U.S. PATENT DOCUMENTS

| | | | | |
|---|---|---|---|---|
| 2010/0013480 | A1* | 1/2010 | Yusa | G01R 33/341 |
| | | | | 324/309 |
| 2012/0273203 | A1* | 11/2012 | Lawrence | E21B 49/088 |
| | | | | 166/305.1 |
| 2014/0027764 | A1* | 1/2014 | Yamazaki | H01L 27/088 |
| | | | | 257/43 |
| 2014/0055138 | A1* | 2/2014 | Takegoshi | G01R 33/3403 |
| | | | | 324/322 |
| 2014/0218025 | A1* | 8/2014 | Wong | G01R 33/44 |
| | | | | 324/309 |
| 2014/0336485 | A1* | 11/2014 | Mujeeb-U-Rahman | |
| | | | | G01N 27/48 |
| | | | | 600/345 |
| 2015/0038750 | A1* | 2/2015 | Weiss | C25B 3/02 |
| | | | | 570/241 |

* cited by examiner

HIGH-RESOLUTION IN SITU ELECTROCHEMICAL NMR WITH INTERDIGITATED ELECTRODES

CROSS REFERENCE TO RELATED APPLICATION

This application is the U.S. National Stage of International Application No. PCT/US2016/054959, filed Sep. 30, 2016, which was published in English under PCT Article 21(2), which in turn claims the benefit of the earlier filing date of U.S. provisional application No. 62/236,772, filed Oct. 2, 2015, which is incorporated herein by reference in its entirety.

STATEMENT OF GOVERNMENT INTEREST

This invention was made with government support under grant number DE-FG02-07ER15895 awarded by the Department of Energy. The government has certain rights in the invention.

FIELD OF THE INVENTION

This invention relates to nuclear magnetic resonance (NMR) spectroscopy and electrochemistry (EC).

BACKGROUND OF THE INVENTION

Nuclear magnetic resonance (NMR) spectroscopy is a powerful analytic technique for determining the composition of unknown samples. NMR utilizes the magnetic properties of atomic nuclei in order to determine the physical and chemical properties of samples. Despite its extensive presence as a powerful analytic technique it remains underutilized in organic chemistry when studying electrochemical reactions. This is due to the presence of conducting metallic electrodes that are required for maintaining current and the presence of conducting electrolytes. The presence of the electrodes and electrolytes in electrochemical reactions is known to warp the magnetic field. Since a homogenous magnetic field is necessary for accurate and sensitive NMR spectroscopy, the inclusion of such electrodes and electrolytes poses a problem. Since the electrodes and electrolytes have adverse effects on conventional NMR probes, which compromise their sensitivity, their usefulness thus far has been minimal.

Additionally, electrolysis is a firmly established fundamental technique for driving non-spontaneous chemical reactions in organic chemistry. The ability to use NMR during electrolysis experiments in electrochemistry and electro-synthesis would allow for a better understanding of the reactions and their products. Despite considerable efforts to create a system that would allow NMR spectroscopy in the field, the community has not adopted the technique as a general in situ tool. There is considerable need for a simple, electrolysis-friendly, NMR design that can overcome these remaining challenges in order to allow this powerful tool to achieve large-scale use in electrolysis and electrochemical investigations.

SUMMARY OF THE INVENTION

One aspect of the present invention provides for an electrochemical NMR (EC-NMR) system that allows for high-resolution in situ NMR on samples undergoing electrolysis. An aspect of the invention provides a system for EC-NMR that is robust and compatible with commercially available NMR instruments. Another aspect of the invention provides a system for use in NMR that does not require modification to commercial NMR probes and can be set up quickly and inexpensively without compromising the high-resolution features of solution NMR that are critical for molecular spectroscopy.

According to one aspect of the invention, a system for in situ EC-NMR includes an electrode assembly comprising a plurality of interdigitated electrodes that comprise conductive metals deposited on a support. In an embodiment, the electrode assembly is cylindrically symmetric. The electrodes include at least a working electrode and a counter electrode. In certain embodiments, an electro-catalyst is further deposited on the one or more of the electrodes.

An embodiment of the system includes an EC-NMR system comprising: an interdigitated electrode acting as a working electrode; an interdigitated electrode acting as a counter electrode; which can be inserted into an NMR sample tube. The interdigitated electrodes can be positioned inside the NMR sample tube such that the electrodes are in the NMR detection region of the NMR sample tube. The electrodes may be arranged in a manner such they exhibit cylindrical symmetry.

Examples of conductive metals for use as electrodes include, but are not limited to, gold, copper, platinum, palladium, silver, aluminum, zinc, nickel, brass, iron, steel, lead, and alloys thereof.

In an embodiment of the system, the thickness of the conductive metal layer on the electrodes is in a range of about 5-100 nanometers. Alternatively, the range is about 5-50 nanometers. In another embodiment the range is about 5-25 nanometers.

Examples of materials to make supports include, but are not limited to, glass, ceramics, and polymers. The support may be flexible or rigid. For example, the support may be made from materials, including, but not limited to polytetrafluoroethylene (TFE), fluorinated ethylene propylene (FEP), polyethylene, polypropylene, silicon, and silicate glasses. In an embodiment, the support is a polyimide based support.

In an embodiment, the support has a thickness ranging from about 10 to about 100 microns. In an alternative embodiment, a range of about 25-50 microns is used.

In certain embodiments, the electrodes comprise gold or platinum deposited on a support, wherein the symmetry is maintained when the support is rolled into a cylinder. The system may further comprise an electrocatalyst, wherein the electrocatalyst is applied to one or both interdigitated electrodes.

In an embodiment, the electrodes are made from gold and are deposited on the support using any one of a variety of masking techniques. Optionally, strips of copper tape may be applied to the ends of electrodes that are not in the NMR sensitive region of the electrode systems. The film is then rolled into a cylinder and placed within an NMR tube. The placement of the assembly is such that it is within the NMR detection region (e.g. located in a specific area of an NMR tube where NMR spectroscopy will occur).

An embodiment of the system further includes, an electrical feed-through cap that fits on the NMR sample tube wherein the electrical feed-through cap comprises: a working electrode metal finger extending through the cap, a counter electrode metal finger extending through the cap; wherein, when fitted to the NMR sample tube, the electrical fingers make sliding contact with the corresponding interdigitated electrodes; electrical connectors attached to each metal finger, wherein the electrical connectors allow each metal finger to be connected to a potentiostat; and a reference electrode positioned through the cap.

The electrodes of the present invention may be used for NMR-EC experiments inside NMR sample tubes, wherein the electrodes extend into the detection region of the NMR instrument. The NMR sample tube may have a diameter ranging from about 3-15 mm. In certain embodiments the NMR sample tube has a diameter ranging from about 5-10 mm. In certain embodiments, the NMR sample tube has a diameter of about 5 mm or about 10 mm.

A further object of one aspect of the invention is to provide a method of manufacturing an EC-NMR system that is capable of driving electrochemical reactions and or electrolysis while maintaining NMR sensitivity comprising a thin electrode assembly that is symmetrical when rolled into a cylindrical shape.

A further object of another aspect of the invention is to provide a method of carrying out electrolysis and/or an electrochemical reaction with an EC-NMR system in order to determine the make up of a sample and or any intermediate species using NMR spectroscopy.

In a further embodiment the invention includes a method of performing nuclear magnetic resonance spectroscopy during an electrochemical reaction comprising: supplying an interdigitated electrode acting as a working electrode; supplying an interdigitated electrode acting as a counter electrode; and supplying an NMR sample tube, wherein the interdigitated electrodes are positioned inside the NMR sample tube such that the electrodes are in an NMR detection region of the NMR sample tube; and performing nuclear magnetic resonance spectroscopy in the NMR detection region.

In an additional embodiment the invention a method of manufacturing electrochemical nuclear magnetic resonance (EC-NMR) system comprising: (a) cutting a support such that it will fit, when rolled into a cylinder, into an NMR tube; (b) applying a mask to the support; (c) depositing electrodes on the support; and (d) removing the mask to reveal an interdigitated electrode pattern.

The system further includes an electrical feed-through cap that attaches to and seals the NRM tube. The feed-through cap can be constructed from a standard NMR tube cap. The cap includes two metal fingers that are located there through via slits in the cap. The fingers can be fixedly attached to the cap via epoxy or the like. The ends of the metal fingers that protrude from the top have male end connectors attached. Additionally, the cap includes a hole that a reference electrode is fixed through. In an embodiment the reference electrode is a silver wire sealed within a glass tube. Another male end connector is attached to the reference electrode on the top of the feed-through cap in order to provide electrical connectivity.

When the feed-through cap and NMR tube are mated, the metal fingers from the cap make electrical contact with the working and counter electrode located on the film. In an embodiment the electrical contact is made via the copper tape located on the firm.

In an alternative embodiment, the system further includes components that provide a current to the electrodes. According an aspect of the invention the system includes a potentiostat. The potentiostat is electrically connected to the working, counter, and reference electrode via electrical lines that are terminated at female connectors that correspond to the male connectors located on the feed-through cap. These electrical lines are further grounded in order to reduce systemic noise.

A further aspect of the invention comprises a top cover that removeably attaches to the feed-through cap and a tube mount. The top cover includes a housing, the electrical cables that terminate at female connectors with associated inductors, and a support rod. The housing, also referred to as a delrin cap is machined to fit into the tube mount tightly.

According to another aspect of the invention, the electrode assembly is manufactured by (1) cutting a support (e.g. a polyimide film) such that it will fit within an NMR tube (i.e. for a 5 mm NMR tube the dimensions are about 1.2 cm×17 cm); (2) cleaning the support by washing it in a 1:1 nitric acid in water and then in piranha solution, with deionized water rinses in between washes; (3) applying a mask to the film in the shape in the shape of a designed IGE pattern; (5) depositing the electrodes on the film; (6) optionally applying an electro-catalyst to the electrodes; (7) apply a thin strip of copper tape to each of the leads of the electrodes.

According to another aspect of the invention, the steps for carrying out the method of NMR detection include; (1) providing an electrode assembly within an NMR tube; (2) loading the NMR tube with a desired sample; (3) applying the feed-through cap to the NRM tube in order to seal the tube and provide electrical connectivity for the working, counter, and reference electrode; (4) apply a potential to the electrodes such that an electrochemical process occurs within the tube; (5) performing NMR on the sample at set intervals in order to determine the composition of the sample over time.

BRIEF DESCRIPTION OF THE DRAWINGS

The following description, given by way of example and not intended to limit the invention to the disclosed details, is made in conjunction with the accompanying drawings, in which like references denote like or similar elements and parts, and in which.

DETAILED DESCRIPTION

Embodiments of the invention are described below with reference to the accompanying drawings which depict different embodiments. However, it is to be understood that application of the invention encompasses other uses for the invention in applications involving nuclear magnetic resonance (NMR) spectroscopy. Also, the invention is not limited to the depicted embodiments and the details thereof, which are provided for purposes of illustration and not limitation.

Figure 1A:
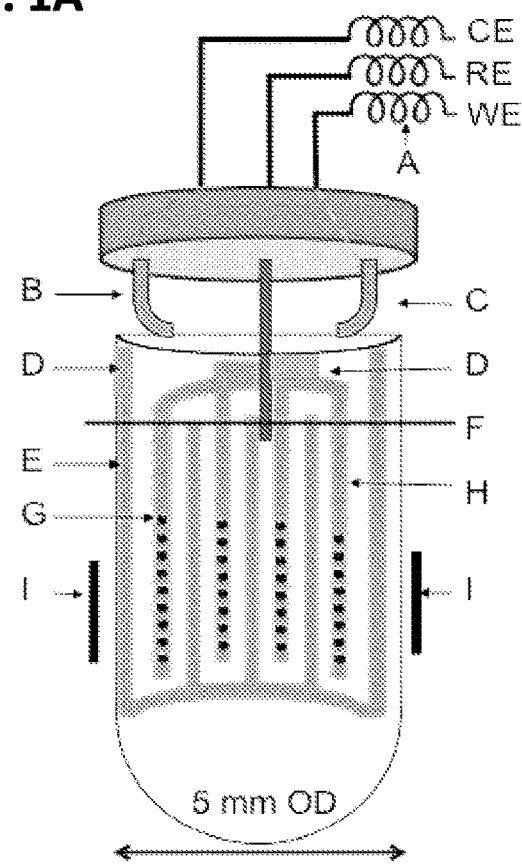
FIG. 1A is a front view of an interdigitated gold electrode (IGE) assembly placed within a 5 mm NMR tube with the feed-through cap installed.
Figure 1B:
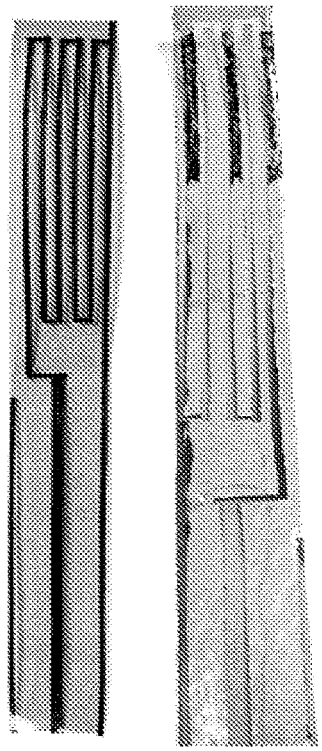
FIG. 1B is a close up of the IGE assembly before placement in an NMR tube

FIG. 1A shows a system design of an embodiment of an electrochemical nuclear magnetic resonance spectroscopy system (EC-NMR) including an interdigitated gold electrode (IGE) assembly, a feed through cap, and NMR tube. Included on the IGE assembly are interdigitated working electrode F, interdigitated counter electrode H, and copper tape D. As can be seen in FIG. 1A the copper tape abuts the ends of the working electrode and counter electrode. Alternatively the tape may be applied on top of the leads of the electrodes (so long as the tape and electrodes are in electrical contact). Additionally, the feed-through cap includes a reference electrode and metallic fingers B and C. The assembly also includes 200 µh indicators A as RF chokes. IGE assembly is rolled into a cylinder and inserted into the NMR tube. The IGE assembly is placed within the tube such that it is in the NMR detection region (the NMR coils are designated as "I" in FIG. 1A). An illustrative electrolyte level F is shown in FIG. 1A. The detection region is the portion of the tube that is exposed to the magnetic field of the NMR system.

The feed-through cap attaches to the top of NMR tube in order to seal the interior such that NMR spectroscopy can be carried out on a sample therein. It can also be seen from the figure that the working electrode, counter electrode, and reference electrode are all electrically connected to male connectors (further described below) in order to provide and electrical current to the electrodes. Although the specification will refer to the electrode assembly as IGE assembly it is to be understood that "gold" is merely a metal to be used in one embodiment of the system and the specification and invention are not intended to be limited as such. As will be evident from the below disclosure other materials can be used in the creation of the electrodes. The important features of the selected metal include: inertness, lack of reactivity to the electrochemical reaction, and conductivity.

IGE assembly is manufactured in order to create a symmetrical electrode arrangement that consists of a working and counter electrode. The first step in creating IGE assembly is sizing a support such that it will fit within NMR tube. In an embodiment of the system the NMR tube is a 5 mm tube (e.g. 5 mm tube width), while in an alternative embodiment the tube is a 10 mm tube. However, a wide range of NMR tubes are suitable for use (3-10 mm tubes). The support can be fabricated from a 25 or 50 micrometer thick polyimide film. However, the support is not limited to polyimide and can be constructed from an array of polymers, ceramics, and glasses (e.g. Teflon, Kaflon, and other plastics). It is further possible to have a non-flexible substrate that is already formed into the desired cylindrical shape prior to use. Additionally, the thickness of the support is not limited to 25 or 50 microns and is contemplated to be in a range of about 10-100 microns. When using a 5 mm tube, the support is cut, such that its dimensions are approximately 1.2 cm×17 cm. In alternative embodiments the dimensions range from a width of about 0.5-3 cm and a length about of 10-40 cm. The support is then cleaned by washing for 30 minutes in 1:1 nitric acid in water and then for 30 minutes in piranha solution, with deionized water rinses in between washes. Alternatively, the cleaning can be for shorter or longer periods of time (10 minutes to an hour) and the wash can be in a wide array concentrations (e.g. 1:10 up to 10:1 ratios and beyond). This cleaning step is critical in order to ensure that subsequent deposition of the electrodes provides adequate adhesion. Although polyimide is disclosed as the material for the support above, other materials have been contemplated as discussed.

After cleaning, a mask is applied to the support in a shape that is complementary to the desired pattern for the electrodes. The mask may be created using a variety of techniques including but not limited to: cutting adhesive tape, creating a mask using a 3d printer, cutting a mask from a thin Teflon sheet. Once the mask is placed on the support electrodes are formed on the exposed areas. In an embodiment, the electrodes are gold. However, other materials have been contemplated and are suitable including silver, silver-chloride, platinum, gold-platinum, copper, zinc, brass, other alloys and other metals. Key characteristics in selecting the metal are conductivity and inertness. The means for deposition of the electrodes can be any one of the following; high-vacuum magnetron plasma deposition (CVC); thermal evaporation; or atomic layer deposition. It should be noted that this is not an exhaustive list and other methods are contemplated. The electrodes are deposited directly to the support to the desired thickness.

Additionally, the shape of the IGE electrodes is an important aspect of the invention. In order to further reduce the warping effects of having metal in the NMR detection region the electrodes must be symmetrical when rolled into the cylindrical shape. It is further advantageous to shape the working and counter electrode in an interdigitated fashion. In such a configuration the working electrode and counter electrode each comprise a plurality of "digits" that alternate across a longitudinal axis of the assembly. In an embodiment the electrodes may be patterned in differing configurations so long as a symmetrical shape is maintained.

The thickness of the electrodes is critical to aspects of the invention. Having thinner electrodes on the support reduces the impact the IGE assembly will have on the magnetic field during use. In an embodiment, the thickness is determined based upon the skin depth of the magnetic field. Depending on the frequency of the magnetic field produced, the NRM system will have a specific RF penetration depth (i.e. a skin depth). The higher the frequency (e.g. in the gigahertz range) the greater the skin depth. In an embodiment of the system, the thickness of the electrodes is a function of the skin depth of the magnetic field. In an aspect of the invention, the thickness of the working and counter electrodes is about 0.5-1.5% of the skin depth. In another aspect of the invention the thickness is about 0.1-2.5% of the skin depth.

In an alternative embodiment, the thickness of the electrodes of the IGE assembly is about 20-100 nm. In another alternative embodiment a thickness of 50 nm is used. A 50 nm thickness for the electrode deposition has found to be optimal through testing when a frequency of 300 Mhz is used. As FIG. 4C shows the thickness of electrodes is proportional to the ohmic drop experience from the top of the NMR tube to the bottom. As more gold was deposited, the ohmic drop from the top of the tube to the bottom decreased, leading to better electrochemical performance. However, a thicker gold coating also lead to lower quality factors and a frequency shift of the probe resonance such that our narrow-band probe had trouble tuning to the correct frequency. Both effects cause a reduction in probe sensitivity. A thickness of 50 nm results in a final loaded quality factor of 100 while keeping the resistance under 200 ohms.

If an electrocatalyst is desired (shown as G in FIG. 1A), it is then applied to either the working or counter electrodes (or both, depending on application) after electrode deposition but before the mask is removed to prevent shorting the electrodes and ensure their electrical isolation. The mask is then removed, revealing the interdigitated electrode.

After the electrode deposition and mask removal, thin strips of copper tape 2 cm in length are applied to the top of each of the leads (i.e. the work and counter electrode ends) for reinforcement. These copper leads are important in order to ensure that when assembled, and electrical connections are made, the electrodes are not damaged or scratched. Although copper is mentioned above other suitable electrical conductors have been contemplated including but not limited to: gold, silver, platinum, zinc, brass and other alloys. Additionally the length of the copper strips is not limited to 2 cm but can range from about 1-10 cm in length.

Figure 2A:
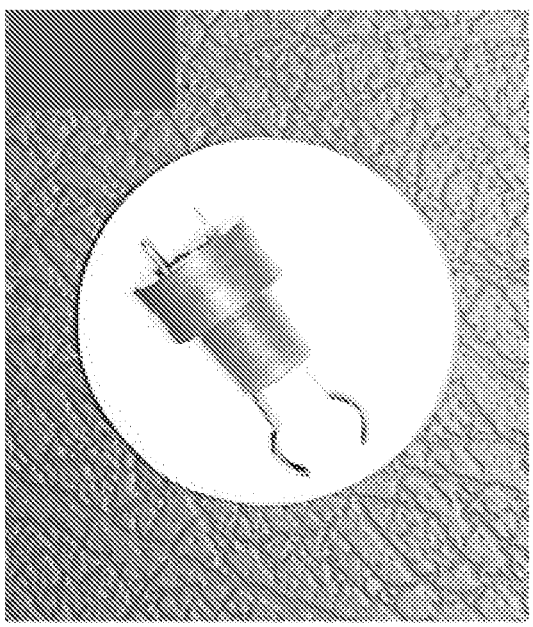
FIG. 2A is an embodiment of the feed-through cap omitting the reference electrode and connectors.
Figure 2B:
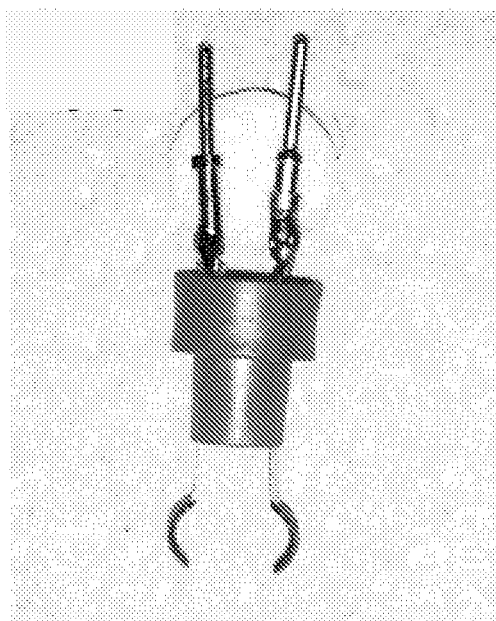
FIG. 2B is a an embodiment of the feed-through cap where the female connectors have been attached.
Figure 2C:
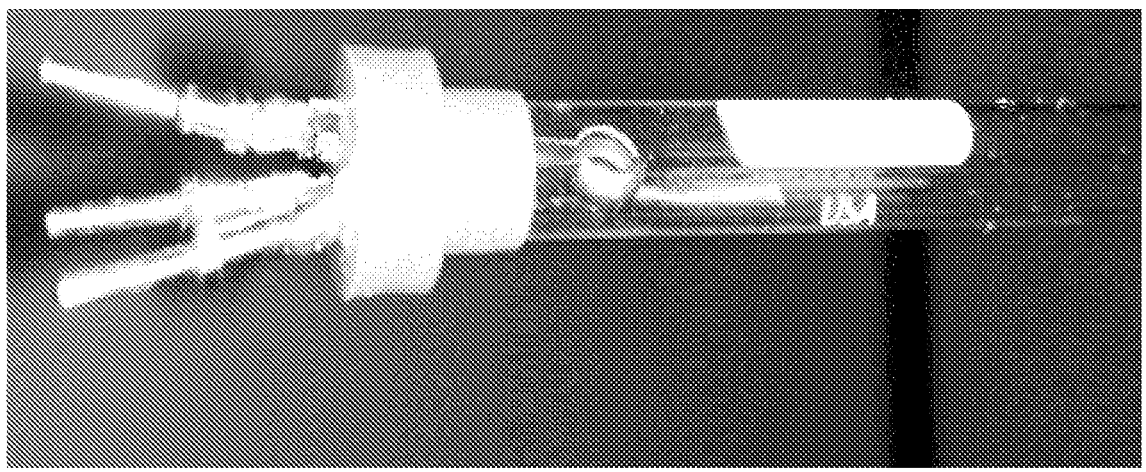
FIG. 2C is a an embodiment of the feed-through cap where the female connectors and reference electrode have been attached.

FIGS. 2A-2C show the construction of the feed-through cap previously shown in FIG. 1A. The first step in construction of the cap, as shown in FIG. 2A, to create small slits within the cap. These slits allow for gold-plated metal fingers to be inserted into the cap. The metal fingers can be glued into the cap with a simply epoxy or other glue for additional stability. The curved portions of each of the metal fingers are intended to make electrical contact with the copper tape such that when assembled the working electrode and counter electrode electrically terminate outside of the tube.

As FIG. 2B shows, once the metal fingers are secured into the cap, the ends of the fingers that protrude from the top of the cap are soldered to the male ends of push connectors. The use for these push connectors will become evident based upon further disclosure below. Lastly, as shown in FIG. 2C, a reference electrode is attached to the cap. An additional hole is drilled in the center of the cap for the lead to the reference electrode. In an embodiment, this electrode is a thin chlorinated silver wire sealed in a 1.5 mm OD glass tube terminated with a glass frit for ion conduction. However, the wire may be made from other metals and sealed in a glass tube of varying sizes. Like the metal fingers, the portion of reference electrode that protrudes from the top is also fit with a male push connector. It should be noted that the gold plating on the metal fingers is important to avoid corrosion that can interrupt electrical contact. Although the disclosure makes reference to the metal fingers being coated gold other materials have been contemplated, including but not limited to: gold, silver, platinum, zinc, brass and other alloys.

Once assembled the feed-through cap, NMR tube, and IGE assembly are ready for use in NMR spectroscopy. Electrical lines from a potentiostat are terminated in female components of metal connectors that are then attached to the NMR sample tube via male connectors as described above. In an embodiment, the electrical lines are RG-316 coaxial cables. However any suitable coaxial cable may be used. For noise control purposes, it is important to ground the coaxial cables to the magnet of the NMR spectroscopy apparatus to establish a common electrical ground potential between the potentiostat and the magnet system. To ground the lines, about 2 cm of outer plastic insulation from the three electrical lines is removed and the lines are joined together with a grounding strap. The grounding strap is attached to the magnet, effectively establishing a common ground.

Figure 3A:
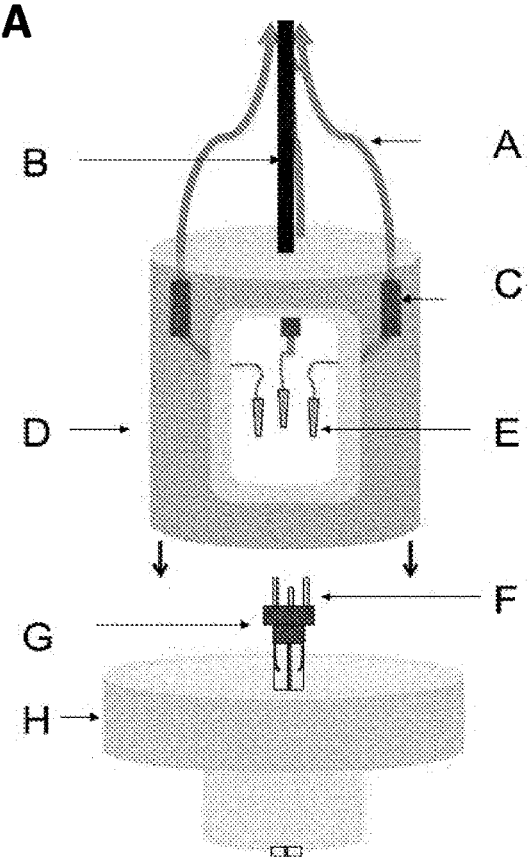
FIG. 3A shows an embodiment where the IGE assembly, feed-through cap, and top cover are shown prior to the top cover fitting over the NMR tube support.
Figure 3B:
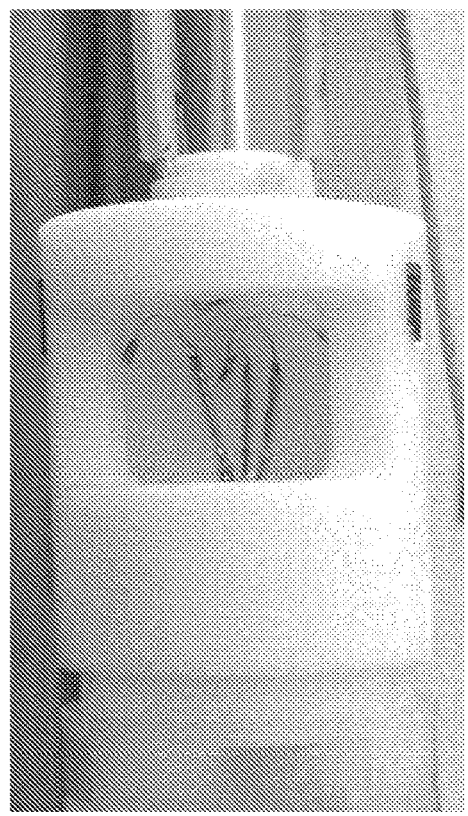
FIG. 3B shows an embodiment where the top cover is fitted over the NMR tube support.

FIGS. 3A-3B show an optional component of the system, a top cover D. The top cover is designed to mate with the assembled system previously described while also stabilizing the tube when it is placed in an NMR tube mount. In an embodiment, the top cover is constructed of 2 inch Delrin and machined to fit a wide-bore 300 MHz magnet (5 cm bore diameter for sample loading). However, other suitable materials have been contemplated including an array of polymers and ceramics. The coaxial cables A (i.e. the electrical lines referenced above) for electrochemistry feed through the top of the top cover as shown in FIG. 3A, and the attached aluminum rod B facilitates rapid sample changes without the concerns associated with pulling directly on the coaxial cables A to retrieve the sample. It is convenient to mount RF isolation inductors C into the top cover to further isolate the DC electrolysis electronics from the high frequency NMR electronics (not shown). The coaxial cables terminate in female components E of connectors that provide electrical connection to the male connectors F of the feed-through cap H. Thus, when the top cover is mounted into tube mount the male connectors and female connectors join, creating an electrically path between the electrodes and the potentiostat.

EXAMPLES AND TESTING

The in situ electrochemical nuclear magnetic resonance spectroscopy system was characterized by evaluating the effects of an electrolyte and the IGE assembly on the sensitivity and performance of a commercial NMR probe. To determine the performance of the design, several standard oxidation/reduction reactions on different nuclei were performed: $^{13}C$ NMR during ethanol oxidation, $^{13}C$ NMR methanol oxidation, and $^{1}H$ NMR during ferrocene oxidation-reduction cycles. NMR was performed on a 300 MHz ($^{13}C$ Larmor frequency 74.47 MHz) wide-bore magnet (not shown) with a hybrid Bruker/Tecmag spectrometer and a standard 5 mm probe. Electrochemistry was performed with a VoltaLab PGZ100 Radiometer potentiostat.

Example 1

Figure 4A:
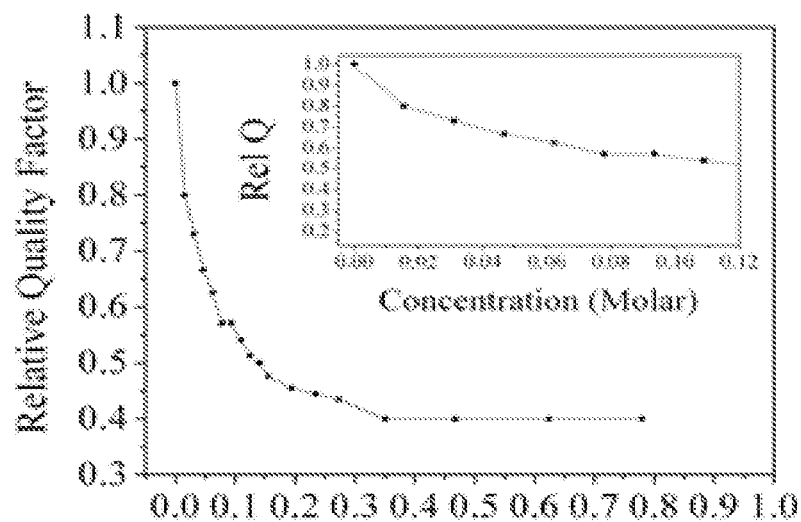
FIG. 4A shows the effect of adding various concentrations of perchloric acid to the system.
Figure 4B:
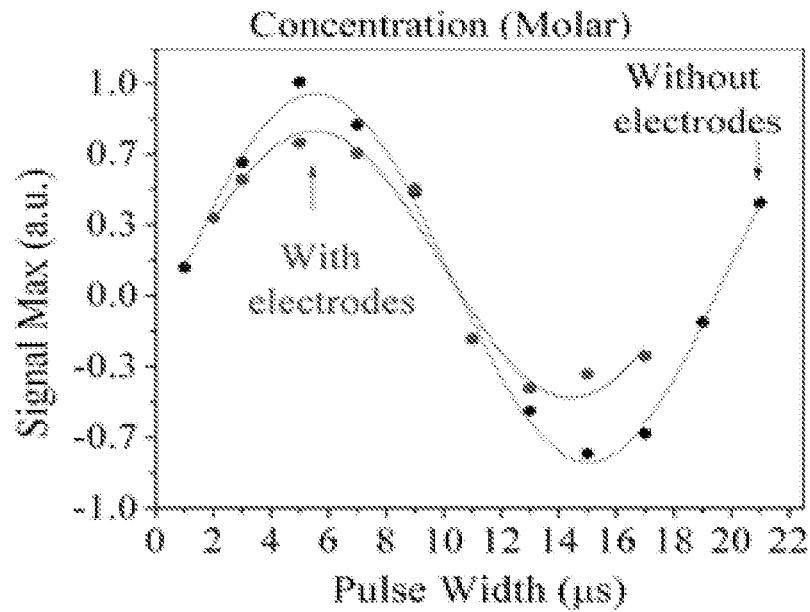
FIG. 4B shows the effect on signal intensity of the IGE electrode assembly during NMR.
Figure 4C:
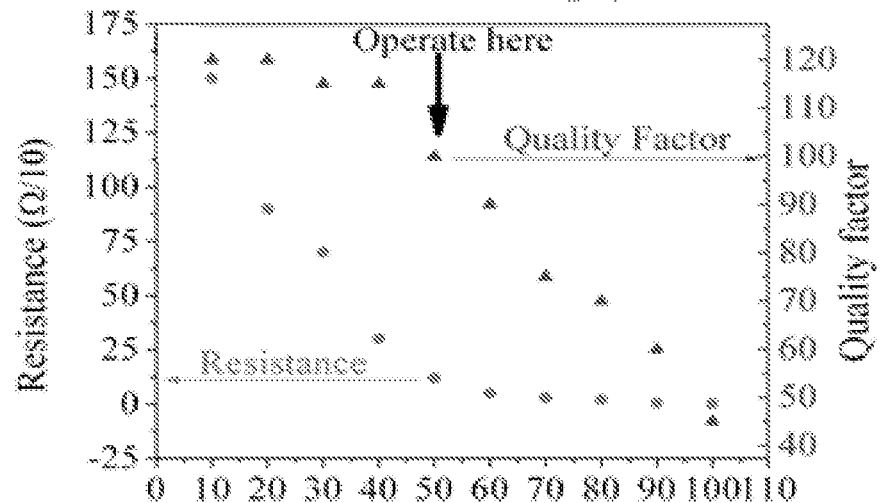
FIG. 4C shows the resistance and quality of the system versus electrode thickness.

FIG. 4a shows the effect of adding various concentrations of perchloric acid supporting electrolyte to the NMR tube with the gold electrodes present. Clearly the ionic liquid has a dramatic effect on the probe sensitivity. The experiments were operated at 0.01M $HClO_4$, thereby sacrificing only approximately 20% of the available sensitivity. With 0.01M $HClO_4$ present in the NMR tube, nutation curves were measured with and without the IGE assembly to determine the effect of the gold electrodes on the probe sensitivity. FIG. 4B shows that while there is a small decrease in signal intensity, the length of the 90-degree pulse (at constant RF power) is approximately the same with and without the IGE assembly present. Thus the thin gold electrodes are not significantly distorting or absorbing the applied RF pulse. After shimming, the width of the resonance spectra was the same with and without the IGE present.

Test 1: Methanol Oxidation

Figure 5:
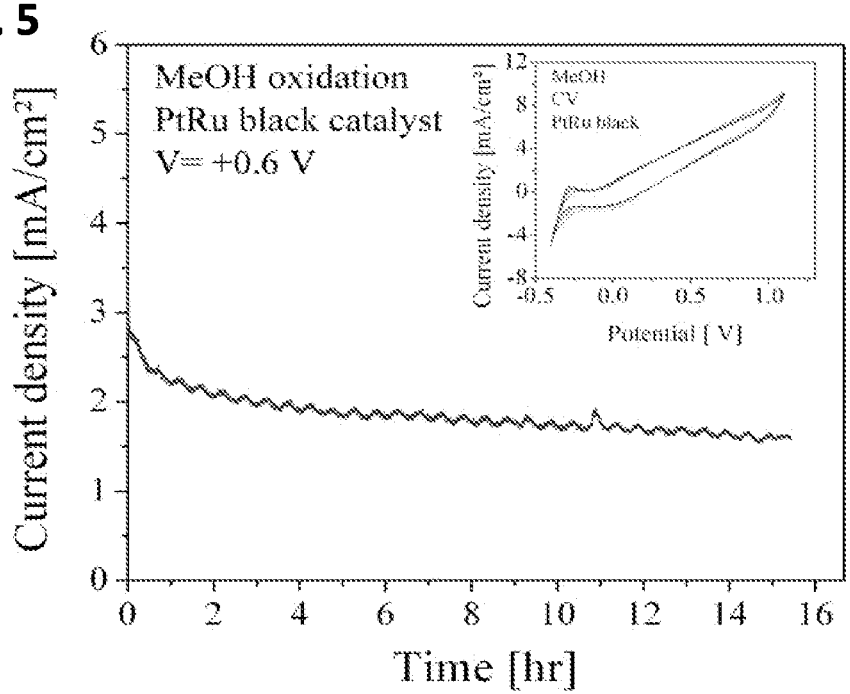
FIG. 5 shows a current density output of feasibility test of the system using methanol oxidation.

As a feasibility test, methanol oxidation was performed in the in situ electrochemical nuclear magnetic resonance spectroscopy system. For this experiment 5M $^{13}CH_3OH$ with 0.01M $HClO_4$ in 1 mL $D_2O$ was used. To catalyze the reaction, 0.1 mL of PtRu black was drop-cast onto the IGE assembly, covered with dilute Nafion solution and air-dried. Before measurements were performed, the catalyst was activated by alternating the electrode potential between −0.5 V and 0.8 V (vs. Ag/AgCl) for 5 s alternatively for 10 cycles. During oxidation, the working electrode was held at +600 mV with respect to Ag/AgCl chlorinated silver quasi-reference electrode. While the potential was applied, NMR was performed at 30 minute intervals to observe the buildup of oxidation products. FIG. 5 shows the chromoamperimetric data taken while holding the potential fixed at +0.6 V. The current of approximately 3 mA decayed by a factor of 2 during the length of the 15 hour experiment. The CV is shown in the inset of FIG. 5.

Figure 6A:
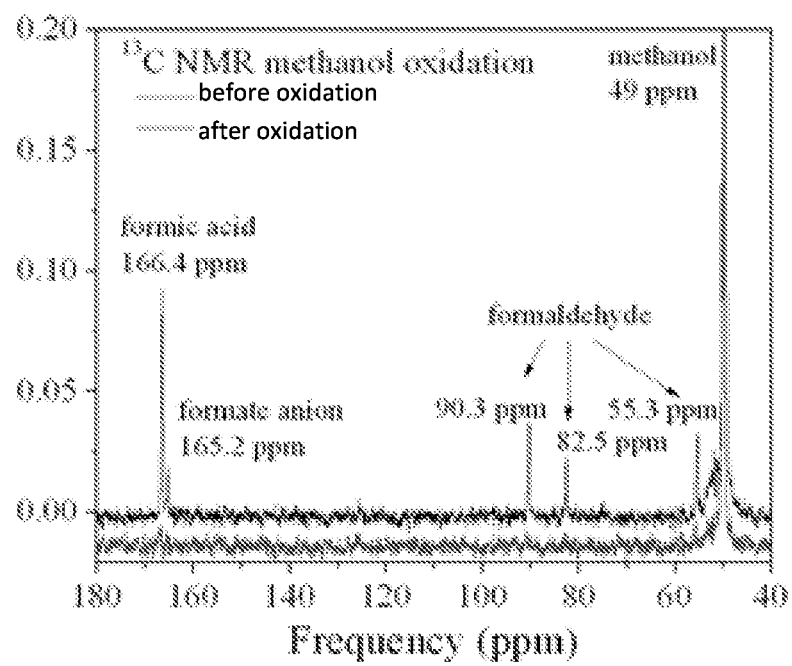
FIG. 6A shows the NMR spectra for the feasibility test using methanol oxidation.
Figure 6B:
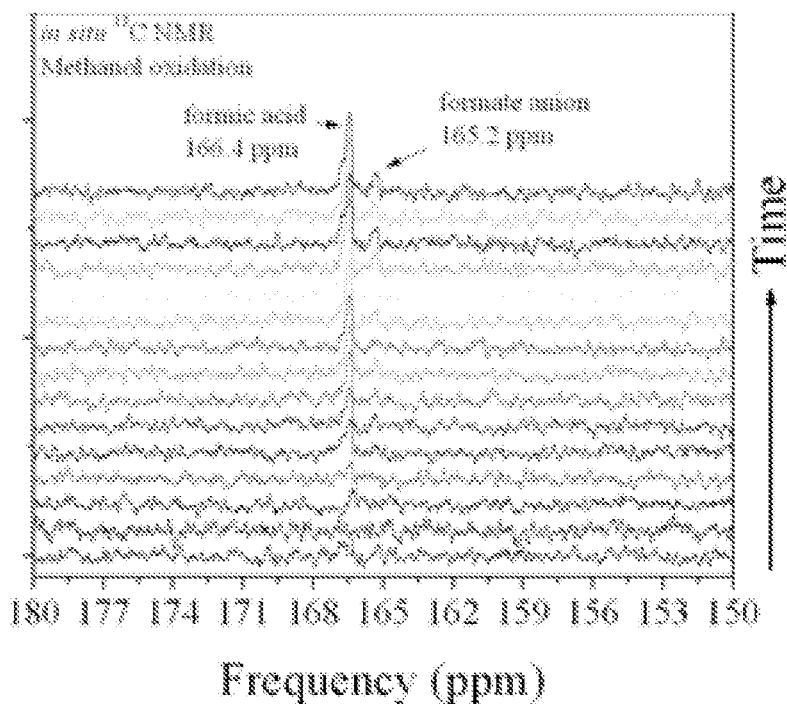
FIG. 6B shows the integrated intensities of carbon resonances in the NMR spectra for the feasibility test using methanol oxidation.

FIG. 6A, shows initial (lower trace) and final (upper trace) $^{13}C$ NMR spectra for the methanol oxidation. The initial trace shows only the methanol resonance at 49 ppm, as expected. The final trace, taken after the 15 hour oxidation period, shows the presence of the stable intermediate oxidation products formaldehyde (90.3 ppm, 82.5 ppm, and 55.3 ppm), formic acid (166.4 ppm), and the formate ion (165.2 ppm), as well as the unoxidized methanol. FIG. 6B shows the buildup over time of the formic acid resonance, demonstrating the in situ data that can be obtained from the electrochemical nuclear magnetic resonance spectroscopy system.

Figure 7A:
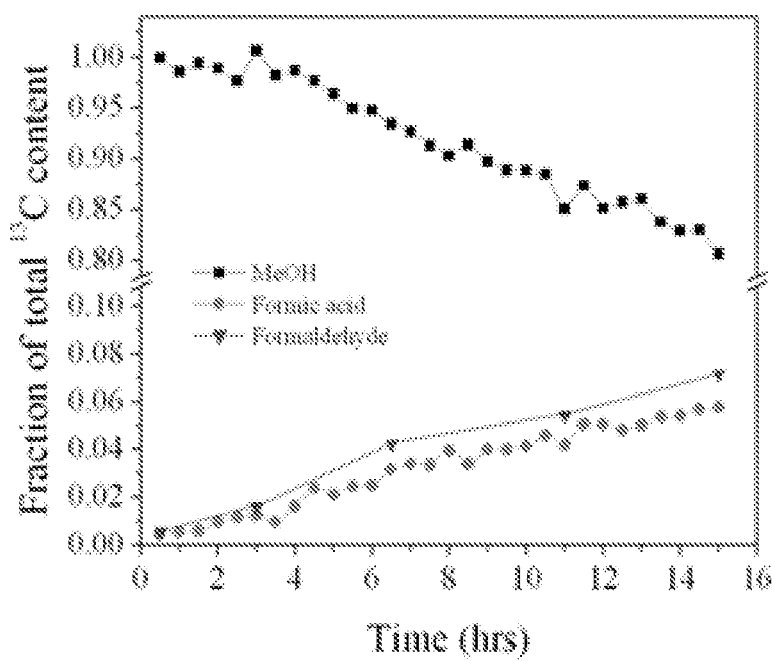
FIG. 7 shows the integrated areas of the time-series of the peak areas of the methanol and intermediate products during the oxidation cycle during the feasibility test.
Figure 7B:
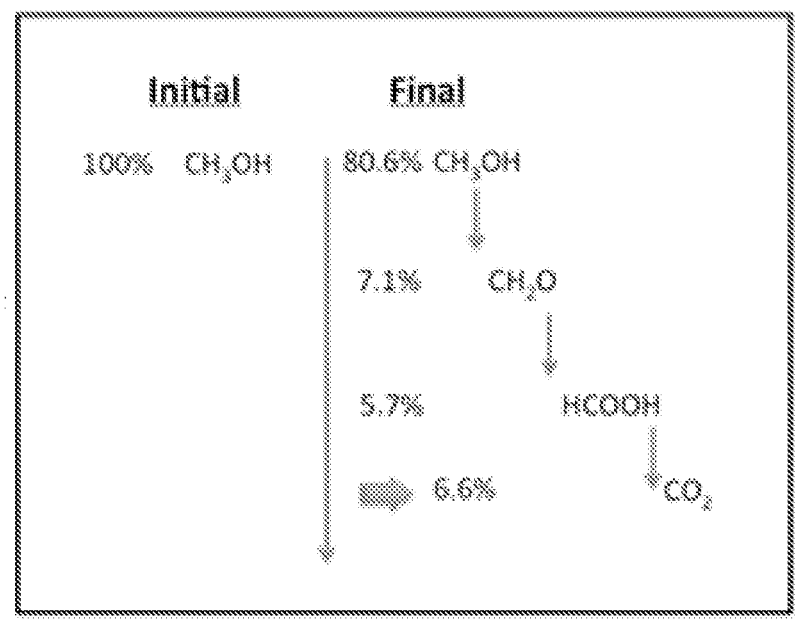

The integrated intensities of carbon resonances in $^{13}C$ NMR like those in FIG. 6b is a reliable method to monitor carbon content, as $^{13}C$ peaks often do not overlap and baseline problems common to $^1H$ NMR spectra are largely absent. The assumption is that the area under the resonance peaks for a given species in $^{13}C$ NMR spectra is proportional to the number of carbon atoms in that species. FIG. 7A shows the integrated areas of the time-series of the peak areas of the methanol and intermediate products during the oxidation cycle. At the end of the oxidation period, 80.6% of the $^{13}C$ atoms remained in unoxidized methanol, 7.1% had formed formaldehyde molecules, and 5.7% had formed formic acid as shown in FIG. 7B. Therefore 6.6% of the original carbon content was fully oxidized to $CO_2$ (and escaped as gas).

Test 2: Ethanol Oxidation

Ethanol oxidation was also performed in the in situ electrochemical nuclear magnetic resonance spectroscopy system. For this experiment 2M $^{13}CH_3CH_2OH$ (98%, Cambridge Isotope) in 0.01M $HClO_4$ with 1 mL $D_2O$ was used. The working electrode was held at +600 mV with respect to the Ag/AgCl quasi-reference. While the potential was applied, NMR was performed on the liquid reactants at 30 minute intervals to observe the buildup of oxidation products. The entire experiment lasted for a period of 20 hours. Activated commercial PtRu black was used as the working electrode catalyst in this experiment.

Figure 8A:
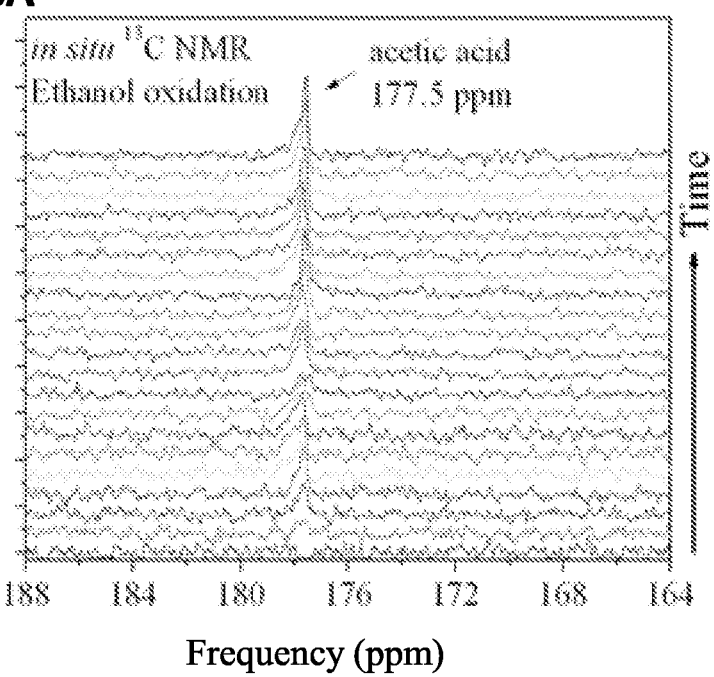
FIG. 8A shows the integrated intensities of carbon resonances in the NMR spectra for the feasibility test using methanol oxidation.

FIG. 8A shows the buildup of the stable intermediate of ethanol oxidation product acetic acid at 177.5 ppm as a function of time. Acetalydehyde, another stable intermediate, is also present at 207 ppm (not shown), as is the unoxidized ethanol resonance at 58 ppm. As with methanol oxidation, the ethanol resonance and the intermediate products' resonances are integrated, and their areas plotted as a function of time in FIG. 8B.

Figure 8B:
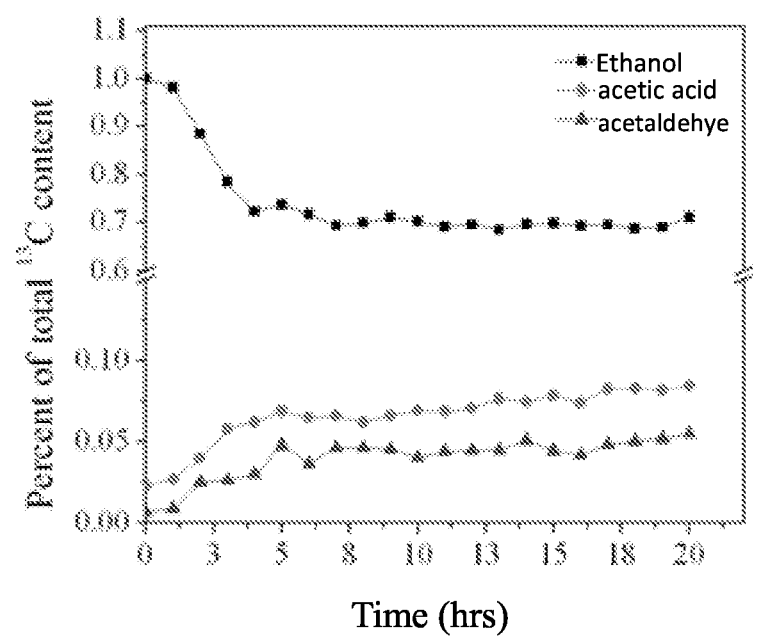
FIG. 8B shows the integrated areas of the time-series of the peak areas of the methanol and intermediate products during the oxidation cycle during the feasibility test.

Ethanol has a much more complicated and less well-understood oxidation pathway. The two observed stable intermediates, acetic acid and acetaldehyde, that were observed have been seen in other investigations of this reaction. As shown in FIG. 8B, the original ethanol carbon content decreased sharply in the first 4 hours of oxidation, and thereafter decreased much more slowly. Correspondingly, the stable intermediates also increased rapidly during the first 4 hours, and thereafter increased at a reduced rate. At the end of 20 hours, the total carbon distribution reveals that of the 29.5% carbon lost from the initial carbon content of the ethanol, 8.4% ended up in acetic acid molecules and 5.5% in acetaldehyde. The remaining 15.6% was, presumably, completely oxidized to $CO_2$ gas and is thus absent from the integrated intensities of the solution state products.

Test 3: Ferrocene Redox Reactions

Figure 9A:
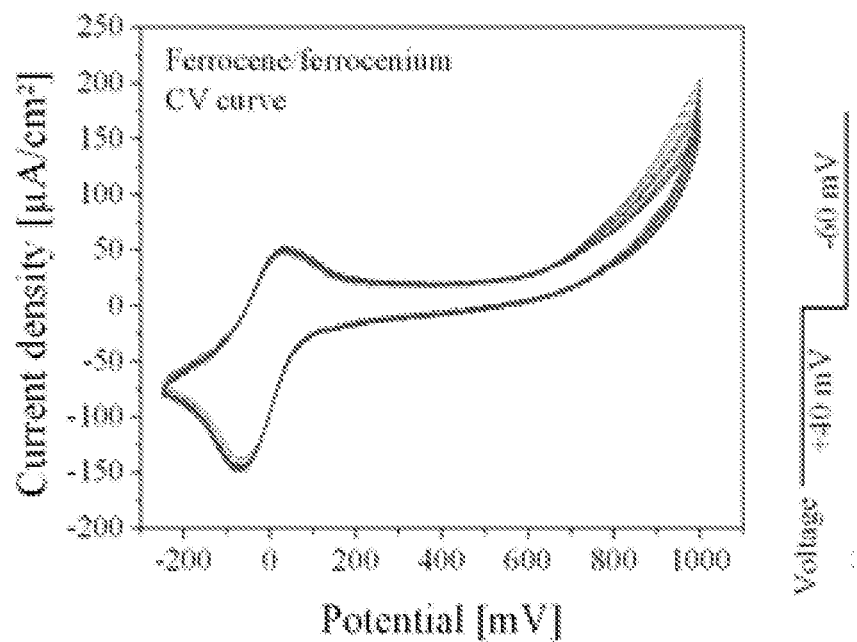
FIG. 9A shows an electrochemically reversible FeIII/II or ferrocenium/ferrocene redox couple's cyclic voltammogram as a result of NMR spectroscopy according to the invention.

To demonstrate the high-resolution and multi-nuclear capabilities of electrochemical nuclear magnetic resonance spectroscopy system, $^1H$ NMR during ferrocene reduction was performed. Ferrocene, $Fe(C_5H_5)_2$, in acetonitrile is a reversible electrochemical system often used as a pseudo-reference for reporting standard reduction potentials in organic phase voltammetry. It was one of the first organometallics to be synthesized, and is remarkably stable at room temperature. The electrochemically reversible $Fe^{III/II}$ or ferrocenium/ferrocene redox couple's cyclic voltammogram is shown in FIG. 9A.

The electrochemical nuclear magnetic resonance spectroscopy system was prepared as described above, with the exception that no catalyst was drop-cast on the electrodes after the gold deposition. A solution of 15 mM ferrocene in 0.1M $Bu_4NPF_6$ in d-acetonitrile was prepared and deoxygenated by bubbling nitrogen through the solution for 10 minutes. Thereafter, the tip of the nitrogen flow tube was raised above the solution while a gentle flow of nitrogen continued to flow. This is important when applying a negative potential as dissolved $O_2$ may be reduced at the working electrode and interfere with the desired reaction.

Figure 9B:
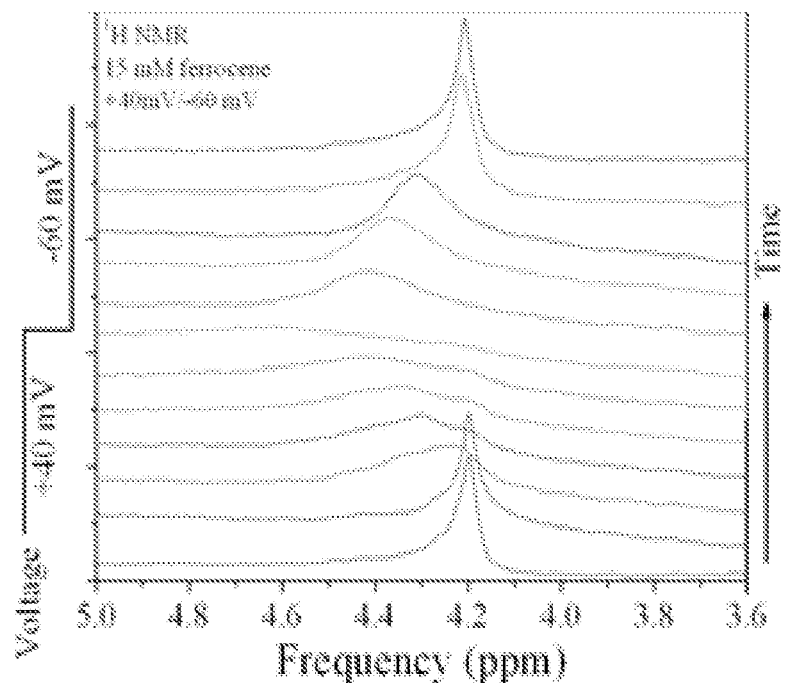
FIG. 9B. shows a graph of the concentration of paramagnetic ferrocenium over time as compared to the applied voltage.

Initially, the ferrocene sample contains no paramagnetic ferrocenium species, and a high-resolution linewidth of $\Delta v=5$ Hz (0.015 ppm) at 4.19 ppm was measured. A cyclic voltagram was measured and the oxidation and reduction potential peaks were identified. The sample was then held at +40 mV to oxidize the ferrocene to ferrocenium while NMR was measured to monitor the reaction in situ. As the concentration of paramagnetic ferrocenium increased, the linewidth increased dramatically and shifted downfield due to fast electron transfer among the aromatic protons (see FIG. 9B). The potential was then changed to −60 mV (corresponding to the reduction peak position) and NMR performed again to monitor the reduction of ferrocenium back to ferrocene. The reaction proceeds quickly, and the resonance is seen to narrow and shift back to its original position as the paramagnetic species is consumed. This reaction was repeated for many cycles by alternating the applied potential.

It will be appreciated by those skilled in the art that various modifications and changes can be made to the invention without departing from the spirit and scope of this invention. Accordingly, all such modifications and changes fall within the scope of the appended claims and are intended to be part of this invention.

The invention claimed is:

1. A method of performing nuclear magnetic resonance spectroscopy during an electrochemical reaction comprising:
   supplying an interdigitated electrode acting as a working electrode;
   supplying an interdigitated electrode acting as a counter electrode; and
   supplying an NMR sample tube,
   wherein the interdigitated electrodes are positioned inside the NMR sample tube such that the electrodes are in an NMR detection region of the NMR sample tube, and wherein the interdigitated electrodes are cylindrically symmetric; and
   performing nuclear magnetic resonance spectroscopy in the NMR detection region that comprises applying a magnetic field having a skin depth, and wherein the working electrode and the counter electrode each have a thickness of 0.1 to 2.5% of the magnetic field skin depth.

2. The method of performing nuclear magnetic resonance spectroscopy during an electrochemical reaction of claim 1, wherein the working and counter electrodes are located on a support.

3. The method of claim 1, wherein the electrochemical reaction is a sample undergoing electrolysis.

4. The method of claim 1, wherein the interdigitated electrodes comprise gold or platinum deposited on a support.

5. The method of claim 1, further comprising an electrical feed-through cap that fits on the NMR sample tube.

6. The method of claim 5, wherein the electrical feed-through cap comprises:
   a working electrode metal finger extending through the cap,
   a counter electrode metal finger extending through the cap;
   wherein, when fitted to the NMR sample tube, the electrical fingers make sliding contact with the corresponding interdigitated electrodes;
   electrical connectors attached to each metal finger, wherein the electrical connectors allow each metal finger to be connected to a potentiostat; and
   a reference electrode positioned through the cap.

7. A method of manufacturing an electrochemical nuclear magnetic resonance (EC-NMR) system comprising:
   (a) cutting a support;
   (b) applying a mask to the support;
   (c) depositing electrodes on the support;
   (d) removing the mask to reveal an interdigitated electrode pattern; and
   (e) rolling the support with the interdigitated electrode pattern into a cylinder for inserting into an NMR tube.

8. The method of claim 7, wherein the electrodes each have a thickness in a range of 5-100 nanometers.

9. The method of claim 8, wherein the interdigitated electrodes comprise gold or platinum.

10. The method of claim 7, wherein the interdigitated electrode pattern comprises gold or platinum.

11. The method of claim 10, wherein the support is a glass, ceramic, or polymer support, and the thickness of the interdigitated electrode pattern is in a range of 5-25 nanometers.

12. The method of claim 7, wherein the support is a glass, ceramic, or polymer support.

13. The method of claim 7, further comprising applying an electrocatalyst to the interdigitated electrode pattern.

14. The method of claim 7, wherein the thickness of the interdigitated electrode pattern is in a range of 5-100 nanometers.

15. The method of claim 7, wherein the thickness of the interdigitated electrode pattern is in a range of 5-50 nanometers.

16. The method of claim 7, wherein the thickness of the interdigitated electrode pattern is in a range of 5-25 nanometers.

17. The method of claim 7, further comprising cleaning the support prior to applying the mask to the support.

* * * * *